(12) United States Patent
Mizuyoshi

(10) Patent No.: US 7,021,799 B2
(45) Date of Patent: Apr. 4, 2006

(54) LIGHT SOURCE UNIT

(75) Inventor: Akira Mizuyoshi, Saitama (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 81 days.

(21) Appl. No.: 10/902,022

(22) Filed: Jul. 30, 2004

(65) Prior Publication Data

US 2005/0023551 A1 Feb. 3, 2005

(30) Foreign Application Priority Data

Aug. 1, 2003 (JP) .............................. 2003-285242

(51) Int. Cl.
*F21V 29/00* (2006.01)

(52) U.S. Cl. ...................... 362/373; 362/249; 362/547; 362/294; 362/218

(58) Field of Classification Search ................ 362/249, 362/231, 240–241, 237, 294, 373, 545, 547, 362/217; 257/98, 100, 712–713
See application file for complete search history.

(56) References Cited

U.S. PATENT DOCUMENTS

| | | | | |
|---|---|---|---|---|
| 5,038,255 A | * | 8/1991 | Nishihashi et al. | 362/547 |
| 5,607,227 A | * | 3/1997 | Yasumoto et al. | 362/249 |
| 5,660,461 A | * | 8/1997 | Ignatius et al. | 362/241 |
| 5,857,767 A | * | 1/1999 | Hochstein | 362/294 |
| 6,170,963 B1 | * | 1/2001 | Arnold | 362/249 |
| 6,480,389 B1 | * | 11/2002 | Shie et al. | 361/707 |
| 6,517,218 B1 | * | 2/2003 | Hochstein | 362/294 |
| 6,641,284 B1 | * | 11/2003 | Stopa et al. | 362/240 |
| 6,652,123 B1 | * | 11/2003 | Wu | 362/252 |

FOREIGN PATENT DOCUMENTS

JP 6-225080 A 8/1994

* cited by examiner

*Primary Examiner*—Ali Alavi
(74) *Attorney, Agent, or Firm*—Sughrue Mion, PLLC

(57) ABSTRACT

Light-emitting element arrays having aligned LEDs are fixed to a stand integrally formed with a heat sink. An attachment surface of the stand is formed with V-shaped grooves working as reflection planes for improving irradiation efficiency. The arrays are separated from printed-circuit boards to be bonded therewith by wires. The array is placed at the bottom of the groove. The printed-circuit board is placed on a step formed at a wall of the groove. Since the array is separated from the resinous printed-circuit board having inferior heat conductance, high efficiency of heat radiation is obtained. Further, since the array is disposed close to the wall, unevenness of intensity distribution of the LEDs is prevented from being enlarged.

11 Claims, 10 Drawing Sheets

PLUS SIDE   MINUS SIDE

PLUS SIDE   MINUS SIDE   PLUS SIDE

PLUS SIDE    MINUS SIDE

MINUS SIDE     PLUS SIDE

LIGHT SOURCE UNIT

BACKGROUND OF THE INVENTION

1. Field of the Invention

The present invention relates to a light source unit including a plurality of light-emitting elements, which are arranged in line.

2. Description of the Related Art

A light source unit comprising a light-emitting element array is known. In this array, a plurality of light-emitting elements (LED, for instance) are aligned (see Japanese Patent Laid-Open Publication No. 6-225080). For example, the light-emitting element array is constituted such that the light-emitting elements are mounted side by side on a printed-circuit board on which a circuit pattern to be connected to a power source is printed. Electrodes of the respective light-emitting elements are electrically connected to the circuit pattern by wire bonding.

This kind of the light source unit comes into use as an original-illuminating light source of a scanner and a copying machine instead of a linear fluorescent lamp conventionally used, since even illuminance distribution is obtained in a longitudinal direction of the light-emitting element array. When this light source unit is used as the original-illuminating light source, a width direction of an original (scanning direction) is set so as to coincide with the longitudinal direction of the light-emitting element array.

Further, it is considered to use the above-mentioned light source unit as a light source for optically fixing a thermosensitive recording paper having optical fixation properties. In this case, higher illuminance is required in comparison with the case of the original-illuminating light source. Thus, the light-emitting element having higher illuminance is used. At the same time, the light-emitting element array is designed such that both ends thereof are provided with reflection planes extending in the longitudinal direction. Meanwhile, when pursuing high power, a calorific value becomes large so that measures for heating are required in accordance therewith.

In the conventional light-emitting element array, the respective light-emitting elements and the circuit pattern to be connected thereto by wire bonding are mounted on a single printed-circuit board. Although resin is generally used as a material of the printed-circuit board, heat conductance of the resin is lower than that of metal. In view of this, it is considered to use a printed-circuit board, which is made of metal instead of resin. The metal is aluminum and so forth. However, unit cost of the aluminum board is expensive in comparison with the resinous board. In addition, processing cost of etching and so forth is high. Thus, there arises a problem in that the cost increases.

The circuit pattern is disposed at each side of the light-emitting elements in the longitudinal direction of the light-emitting element array. Consequently, the circuit pattern is positioned between the light-emitting element and the reflection plane. Thus, it is impossible to shorten an interval between the light-emitting element and the reflection plane. When the interval is broad, there arises a problem in that unevenness of intensity distribution is enlarged in the longitudinal direction (scanning direction). This problem is caused because the light-emitting element array is merely an aggregation of point sources (light-emitting elements) from a microscopic view, although this array is macroscopically regarded as a linear light source. Therefore, the unevenness of the intensity distribution is somewhat caused in the scanning direction in accordance with arrangement intervals of the respective light-emitting elements. The unevenness of the intensity distribution is enlarged and emphasized as the interval between the light-emitting element and the reflection plane becomes broader.

SUMMARY OF THE INVENTION

In view of the foregoing, it is a primary object of the present invention to provide a light source unit comprising a light-emitting element array in which its heat radiation property is improved without increasing the costs.

It is a second object of the present invention to provide a light source unit comprising a light-emitting element array in which unevenness of intensity distribution of the array is prevented from being enlarged.

In order to achieve the above and other objects, the light source unit according to the present invention comprises a light-emitting element array having aligned light-emitting elements, and an attachment stand to which the element array is fixed. The light source unit includes a printed-circuit board which is separately provided from the array and on which a circuit pattern is printed. The circuit pattern is bonded with the array by wires. A groove having a substantially V-shaped section is formed in the attachment stand such that reflection planes thereof are disposed in a longitudinal direction of the array placed on a bottom surface of the groove. A part of a side wall of the groove is formed with a step on which the printed circuit board is placed.

The light-emitting element array may be fixed to the attachment stand via a plate or a sheet on which the light-emitting elements are mounted. Alternatively, the array may be directly fixed without using the plate or the sheet. Meanwhile, the groove may be covered with a reflection coating made of a metal and a dielectric.

When a chip-type element having a parallelepiped shape is used as the light-emitting element, it is preferable that arrangement angle of the respective elements is inclined so as to prevent lateral surfaces of the respective elements from confronting each other in parallel.

Incidentally, it is preferable that the attachment stand is integrally formed with a heat sink. Further, in accordance with purposes, at least two kinds of the light-emitting element arrays may be provided to radiate different wavelengths.

According to the present invention, it is possible to shorten an interval between the reflection plane and the light-emitting element. Consequently, unevenness of intensity distribution may be prevented from being enlarged. Moreover, since the light-emitting element array is separated from the printed-circuit board, heat radiating properties may be improved without using an expensive printed-circuit board having good heat radiating properties.

BRIEF DESCRIPTION OF THE DRAWINGS

The above objects and advantages of the present invention will become apparent from the following detailed description of the preferred embodiments of the invention when read in conjunction with the accompanying drawings, in which.

DETAILED DESCRIPTION OF THE PREFERRED EMBODIMENT(S)

Figure 1:
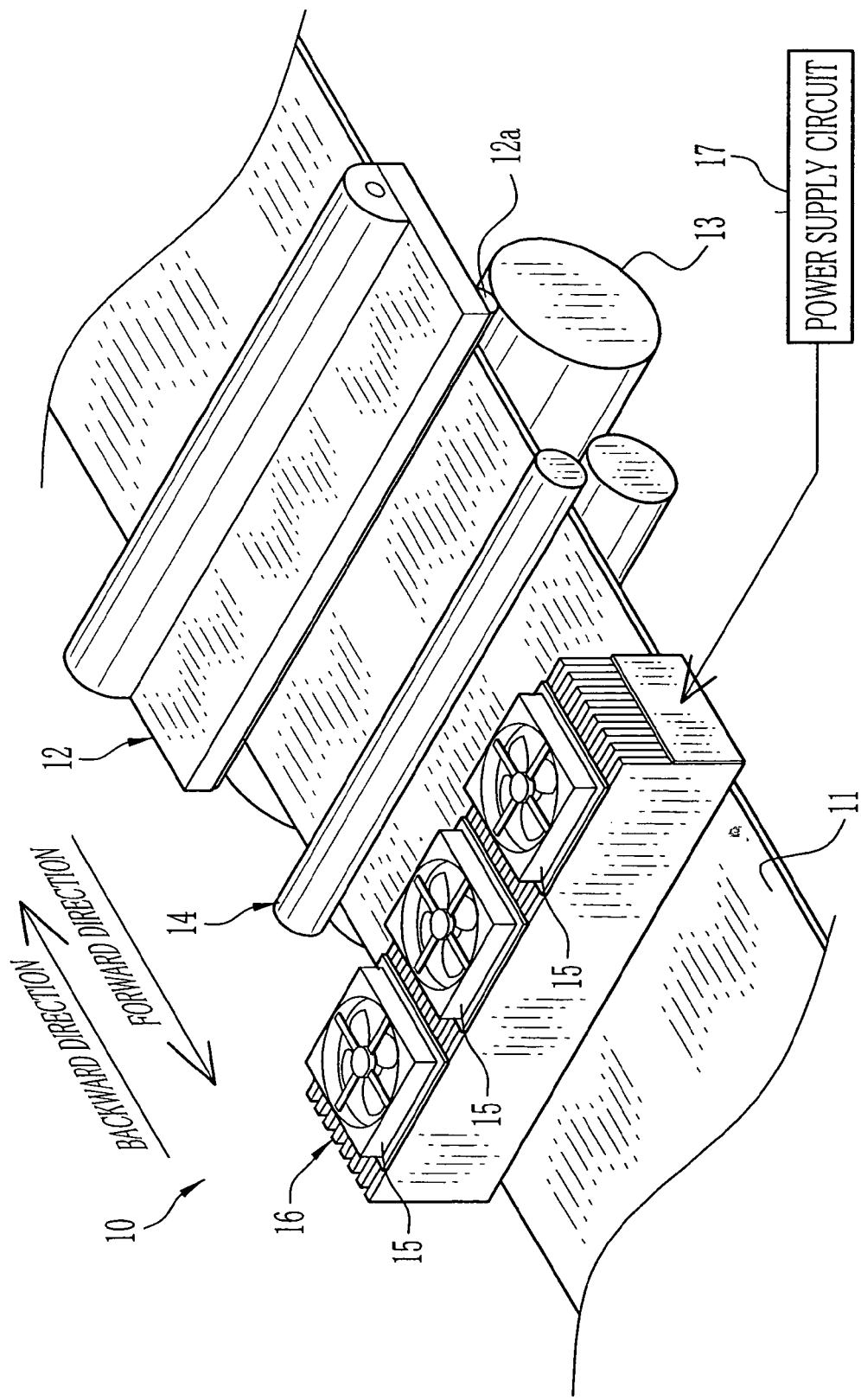
FIG. 1 is a schematic illustration showing a structure of a color thermal printer in which a light source unit is incorporated as a light source for optical fixation.

FIG. 1 shows a color thermal printer 10 in which a light source unit of the present invention is used as a light source for optical fixation. The color thermal printer 10 reciprocates a color thermosensitive recording paper 11 in forward and backward directions. During the reciprocation, it is performed to thermally record a full-color image and to optically fix the recording paper 11 for which thermal recording has been performed.

As well known, the color thermosensitive recording paper 11 comprises three thermosensitive coloring layers of yellow, magenta and cyan, which are formed on a support in this order from the uppermost layer. As to this recording paper 11, the yellow thermosensitive coloring layer being as the uppermost layer has the highest heat sensitivity, and the cyan thermosensitive coloring layer being as the lowermost layer has the lowest heat sensitivity.

Each of the yellow and magenta thermosensitive coloring layers has an optical fixation property relative to rays of a specific wavelength band to prevent an uncolored portion of the upper coloring layer from coloring when the lower coloring layer is heated. After thermally recording an image, the respective coloring layers are optically fixed by radiating the rays of the specific wavelength bands. The yellow thermosensitive coloring layer loses its coloring ability by radiating yellow fixing lays of blue-violet rays, the wavelength of the luminous peak of which is approximately 420 nm. The magenta thermosensitive coloring layer loses its coloring ability by radiating magenta fixing rays of near ultraviolet rays, the wavelength of the luminous peak of which is approximately 365 nm.

A thermal head 12 and a platen roller 13 are disposed at a passage of the recording paper 11. The platen roller 13 is disposed at an opposite position of the thermal head 12 to support the recording paper 11 from a rear surface thereof. As well known, the thermal head 12 comprises a heating element array 12a in which a large number of heating elements are aligned in a scanning direction (width direction of the recording paper). The respective heating elements generate thermal energy in accordance with pixel density. The heating element array 12a is pressed against the recording paper 11 and heats the respective thermosensitive coloring layers to thermally record the images of yellow, magenta and cyan.

A roller pair 14 and an optical fixing unit 16 are disposed at a downstream side of the thermal head 12 in the forward direction. The optical fixing unit 16 is a light source for optical fixation. The roller pair 14 nips the fed recording paper 11 to transport it in a sub-scanning direction, which is perpendicular to the scanning direction. During this transport, the recording paper 11 passes the thermal head 12 and the optical fixing unit 16 to perform thermal recording and optical fixation. The optical fixing unit 16 is connected to a power supply circuit 17 by wiring, which is not shown. Reference numeral 15 denotes a heat radiation fan attached to the optical fixing unit 16.

Figure 2:
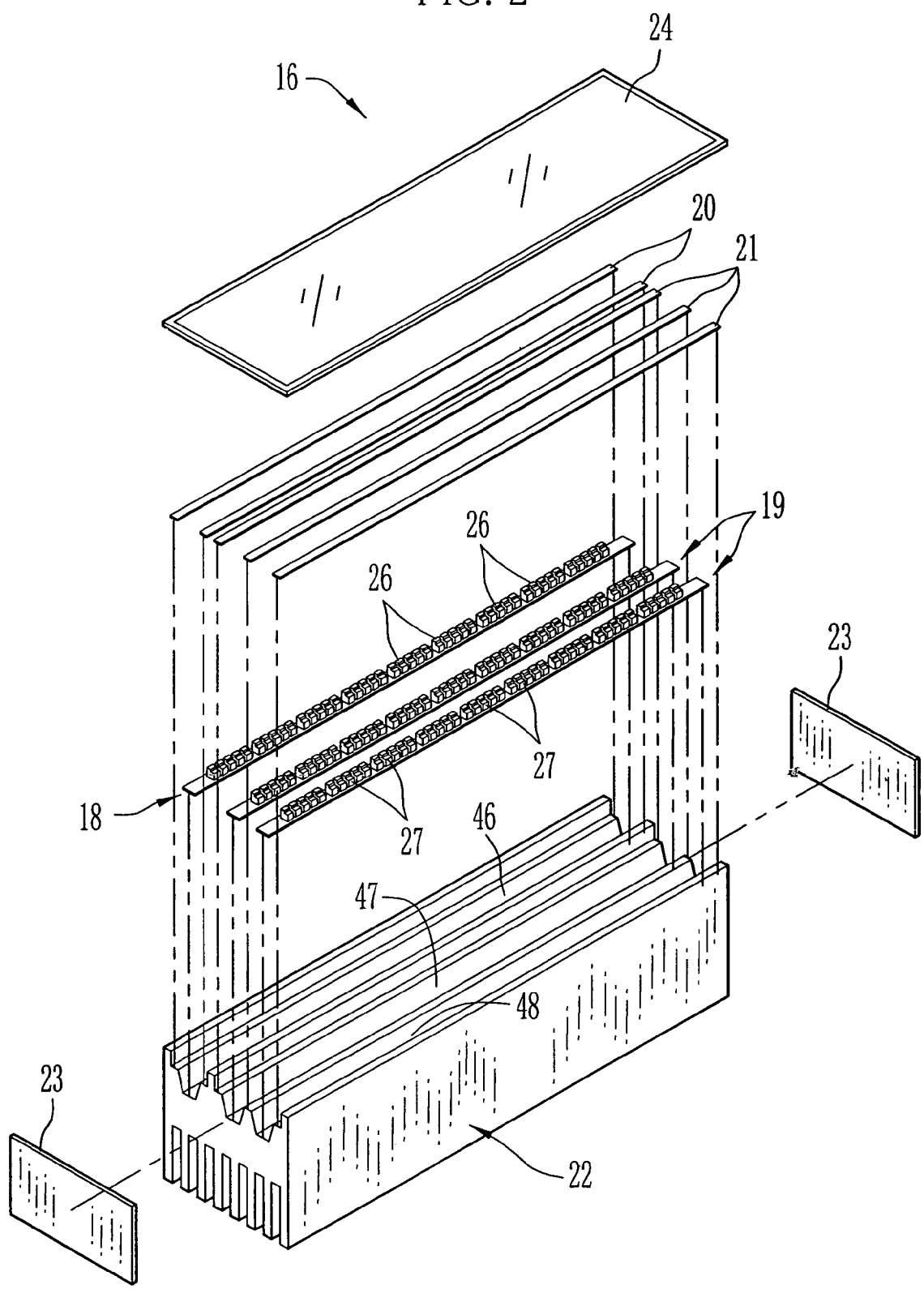
FIG. 2 is an exploded perspective view showing an optical fixing unit.

As shown in FIG. 2, the optical fixing unit 16 comprises light-emitting element arrays 18 and 19 for yellow and magenta, printed-circuit boards 20 and 21, an attachment stand 22, side plates 23, and an irradiation panel 24. A transparent acrylic plate, for example, is used as the irradiation panel 24 to transmit the light emitted from the respective light-emitting element arrays 18 and 19. The optical fixing unit 16 is disposed so as to confront the irradiation panel 24 with the recording paper 11. The side plate 23 is a light shielding plate for preventing the light from leaking to a lateral side.

The light-emitting element array 18 for yellow comprises LEDs (Light Emitting Diodes) for yellow, which are arranged in line. The light-emitting element array 19 for magenta comprises LEDs for magenta, which are also arranged in line. The optical fixing unit 16 is disposed so as to make the longitudinal direction of the arrays 18 and 19 coincide with the scanning direction.

The LEDs 26 and 27 have luminescence wavelengths respectively corresponding to the yellow fixing light and the magenta fixing light. The light-emitting element array 18 for yellow is provided as a single row. In contrast, double rows of the light-emitting element arrays 19 for magenta are provided. This is because sensitivity of the magenta thermosensitive coloring layer is lower than that of the yellow thermosensitive coloring layer, so that higher illuminance is required relative to the magenta fixing light rather than the yellow fixing light.

Figure 3A:
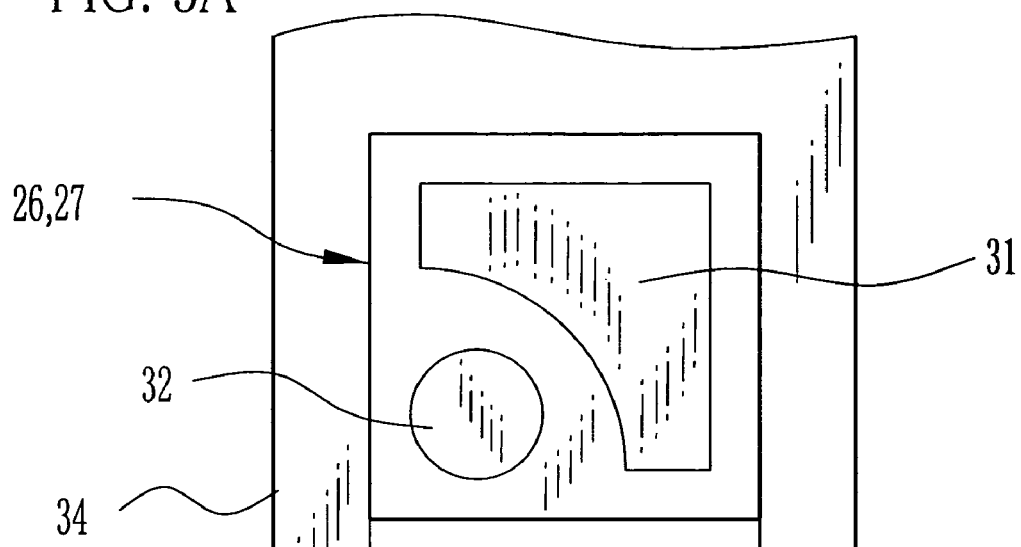
FIGS. 3A and 3B are explanatory illustrations showing a chip-type LED.
Figure 3B:
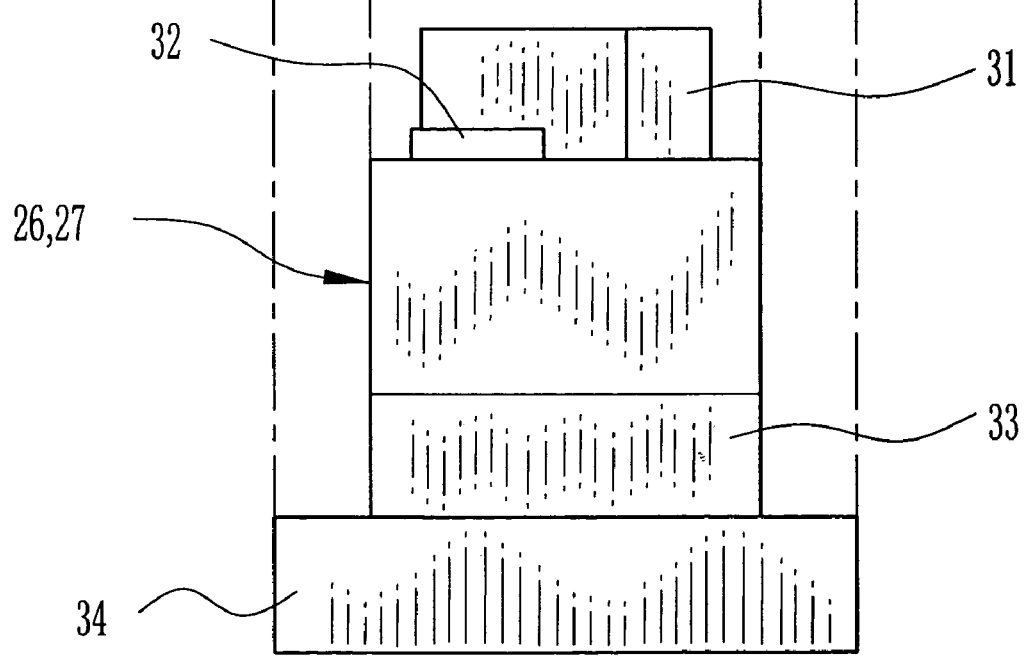

FIG. 3A is a plane view showing an upper surface of the respective LEDs 26 and 27, and FIG. 3B is a side view showing a lateral surface thereof. As to the LEDs 26 and 27, is employed a chip-type LED having no lead portion to be used for wire connection. Each of the LEDs 26 and 27 has a parallelepiped shape, and the upper surface thereof is provided with electrodes 31 and 32 of p (positive) and n (negative). With respect to junction of both the electrodes, MQW (multiple-quantum well) style is adopted. The MQW-style chip has higher energy efficiency in comparison with chips of homojunction and double heterojunction. Regarding a chip substrate 33, a sapphire substrate is used, for example. On the sapphire substrate, various layers are formed with nitride semiconductor material of GaN (gallium nitride) base. The respective LEDs 26 and 27 emit the light from the upper surface and the lateral surface.

Since the sapphire substrate is excellent in deposition of gallium-based material, this substrate is in heavy usage for blue LEDs emitting the ultraviolet rays and the blue light. Instead of the chip using the sapphire substrate, it is possible to employ the other chips using galliun phosphide, gallium arsenide, indium phosphide, SiC (silicon carbide), GaN and so forth as the material of the substrate. It is also possible to employ the chip using a mixture of these materials.

The LEDs 26 and 27 are respectively aligned and fixed on a thin plate 34 having a strip shape. The respective LEDs 26 and 27 are fixed by bonding a lower surface of the chip substrate 33 to an upper surface of the plate 34 with an adhesive. At this time, the adhesive having good heat conductance is used. As to the plate 34, a copper plate having good heat conductance is used, for example. Instead of the plate, a thin sheet may be used.

Figure 4A:
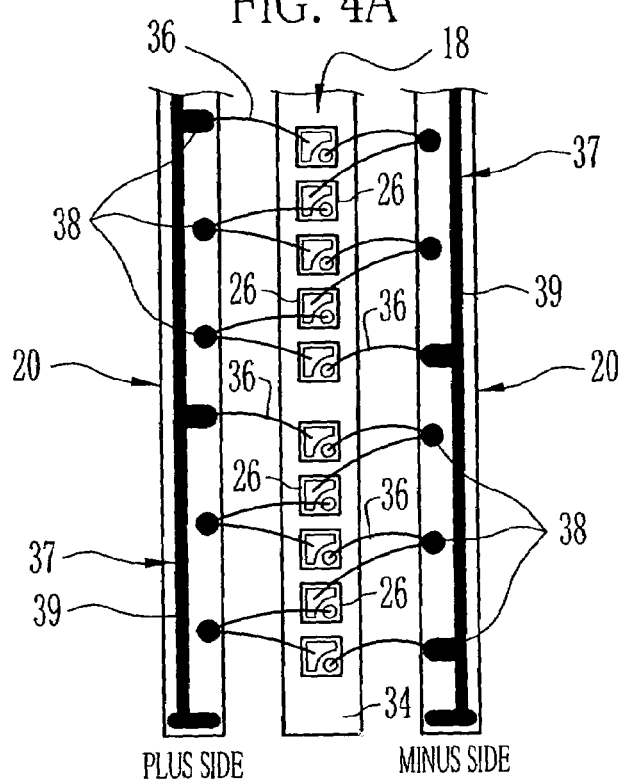
FIGS. 4A and 4B are explanatory illustrations showing a light-emitting element array and a printed-circuit board.
Figure 4B:
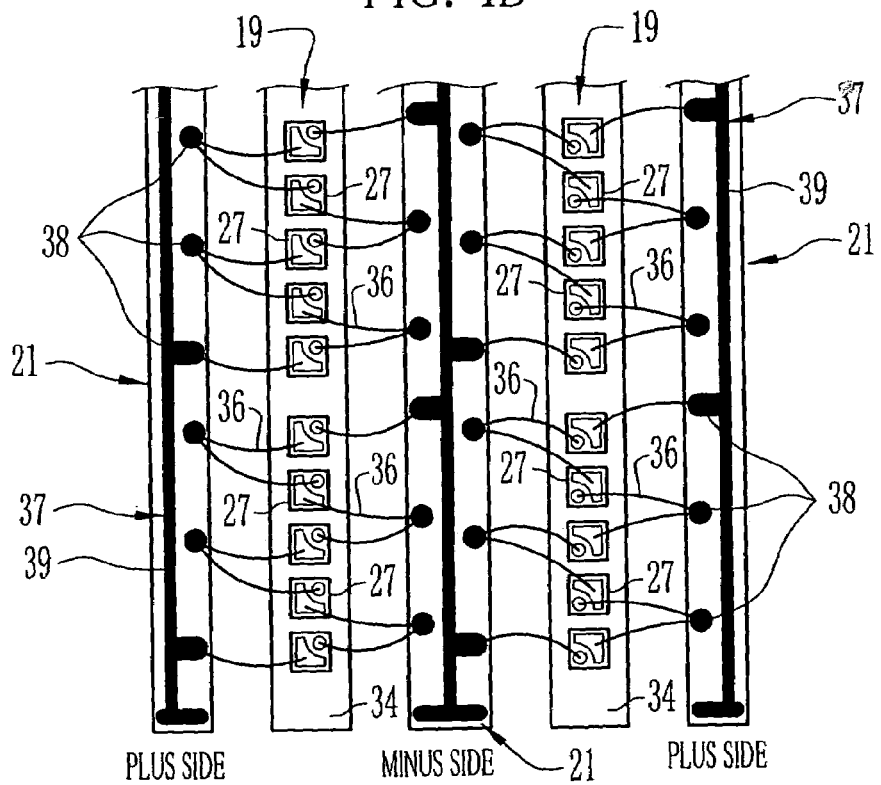

As shown in FIG. 4A, the light-emitting element array 18 for yellow is one row so that the printed-circuit boards 20 of a plus side and a minus side are provided one by one. Meanwhile, as shown in FIG. 4B, the light-emitting element arrays 19 for magenta are two rows so that three printed-circuit boards 21 are provided in total. In other words, two boards 21 are disposed at plus sides of the two rows, and one board 21 is disposed at minus sides thereof. The printed circuit board 21 of the minus side is used as a common board of the two arrays 21. It is needles to say that the printed-circuit board 21 may be provided at the respective minus sides.

The respective arrays 18 and 19 are independent from the respective printed-circuit boards 20 and 21. A circuit pattern 37 for electrically connecting the array to the power supply circuit 17 is printed on the respective circuit boards 20 and 21. The respective arrays 18 and 19 are connected to the circuit patterns 37 by wires 36 to secure the electric conduction. The circuit pattern 37 comprises a bonding pad 38, which is connected to either of the p-electrode and the n-electrode of the respective LEDs 26 and 27, and a conductive portion 39 to be electrically connected to the bonding pad 38. The conductive portion 39 includes a pad from which a wire is stringed to the power supply circuit 17. In this embodiment, by using the circuit pattern 37, the respective LEDs 26 and 27 are connected in series five by five. Five LEDs constitute one set, and the several sets are connected in parallel. Of course, the connecting way may be variously changed, and the connection may be performed by the other ways.

A low-cost resin is used as the material of the printed-circuit boards 20 and 21. Since the printed circuit boards 20 and 21 are separated from the arrays 18 and 19, it is unnecessary to utilize a high-cost metal as the material of the printed-circuit boards 20 and 21 in consideration of heat radiation.

Figure 5:
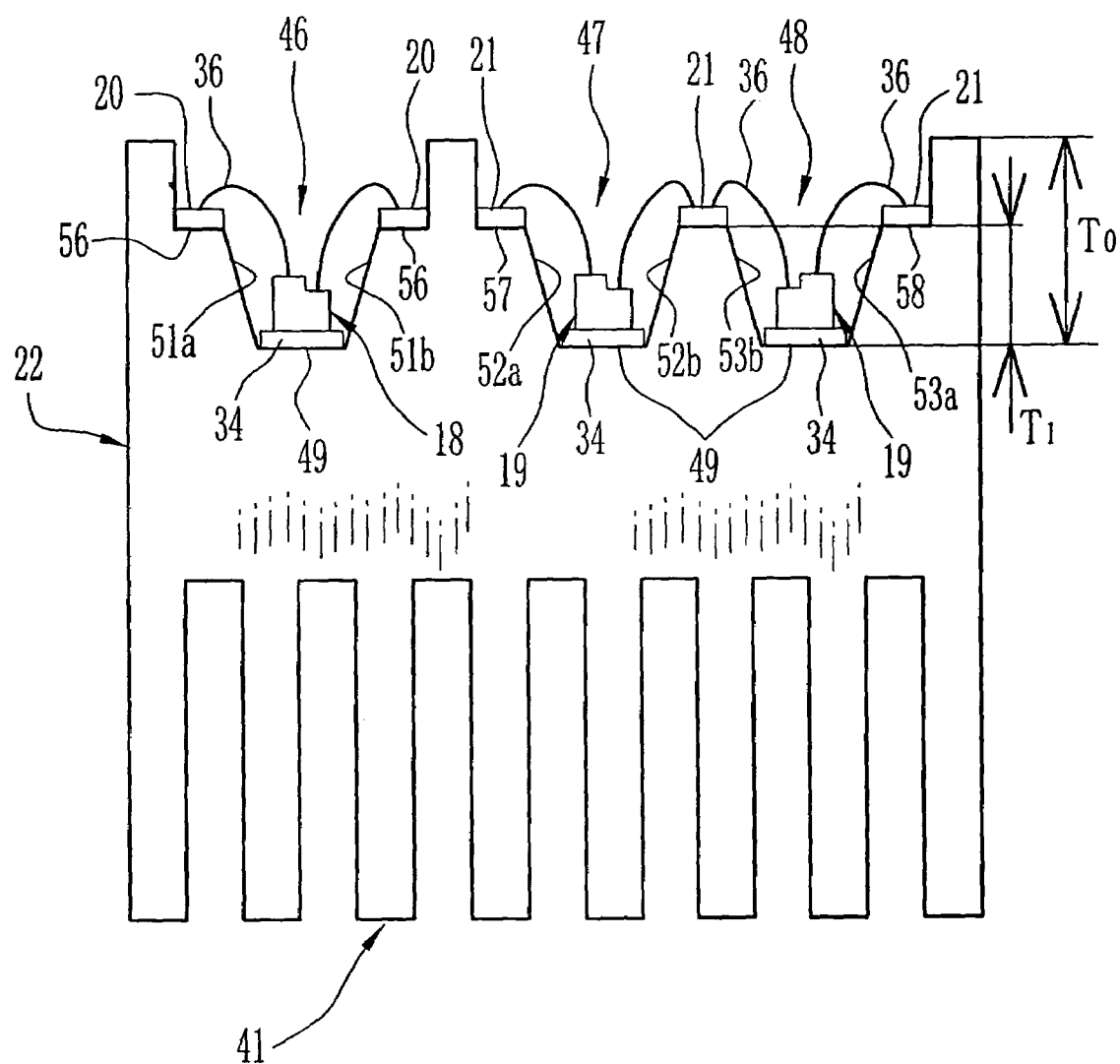
FIG. 5 is a side view showing an attachment stand.

The attachment stand 22 shown in FIG. 5 is made of a metal of cooper, aluminum and so forth, whose heat radiating property is high. The attachment stand 22 is integrally formed with a heat sink 41. By integrally forming them, adhesive to be used for bonding becomes unnecessary and the heat radiating property is improved. Incidentally, in this embodiment, the metal of cooper, aluminum and so forth is used as the material of the attachment stand. However, when accuracy is required so as not to be affected by thermal strain, ceramics of alumina, aluminum nitride and so forth may be used. In the meantime, when it is desired to reduce the cost of parts at the expense of the heat radiating property, a plastic having good heat conductance may be used.

An attachment surface of the attachment stand 22 is formed with grooves 46 to 48 having a V-shaped section. The light-emitting element arrays 18 and 19 are disposed on bottom surfaces 49 of the grooves 46 to 48 one by one. The respective grooves 46 to 48 are formed in order to improve irradiation efficiency of the arrays 18 and 19. Side walls 51, 52 and 53 of the grooves 46 to 48 work as reflection planes for reflecting the light emitted from the arrays 18 and 19, toward the recording paper 11. As described above, the LEDs 26 and 27 emit the light from the lateral surface as well. An amount of the light emitted from the lateral surface is greater than that of the upper surface. Thus, it is very effective to provide the reflection planes at both sides of the LEDs 26 and 27.

In order to improve reflectance of the reflection plane, a reflection coating may be formed on a surface of the respective grooves 46 to 48 by using a metal and a dielectric. The metal is gold, silver, aluminum and so forth. The dielectric is silicon dioxide, titanium oxide, tantalum oxide, tin oxide, indium oxide and so forth. The reflection coating may be formed by using mixed materials instead of the sole material. The material of the reflection coating is properly selected in accordance with a luminescence wavelength of the LED to be used. Incidentally, plating of nickel and so forth may be processed in order to improve adhesiveness with the light-emitting element arrays 18 and 19.

A step 56 for disposing the printed-circuit board 20 is formed at a middle portion of the respective side walls 51a and 51b of the groove 46 on which the array 18 for yellow is placed. In virtue of this, it is avoided to dispose the printed-circuit board 20 between the LED 26 and the reflection plane so that an interval between the LED 26 and the side wall 51 may be shortened. Consequently, unevenness of intensity distribution of the respective LEDs 26 is prevented from being enlarged.

With respect to the grooves 47 and 48 on which the arrays 19 for magenta are placed, steps 57 and 58 are formed at middle portions of the side walls 52a and 53a positioned at both sides of the whole of the two grooves 47 and 48. The printed-circuit boards 21 of the plus side are disposed on the steps 57 and 58. Meanwhile, the side walls 52b and 53b being as partition walls of the grooves 47 and 48 are formed such that a height T1 thereof is lower than a height T0 of the whole grooves. The printed circuit board 21 of the minus side is disposed on an upper surface 59 of the partition walls. It is possible to shorten an interval between the LED 27 and the side wall being as the reflection plane. Thus, unevenness of intensity distribution is prevented from being enlarged, similarly to the light-emitting element array 18 for yellow.

The attachment stand 22 including the heat sink and the respective grooves is formed by using an extrusion mold so that the processing coat is prevented from increasing.

Figure 6:
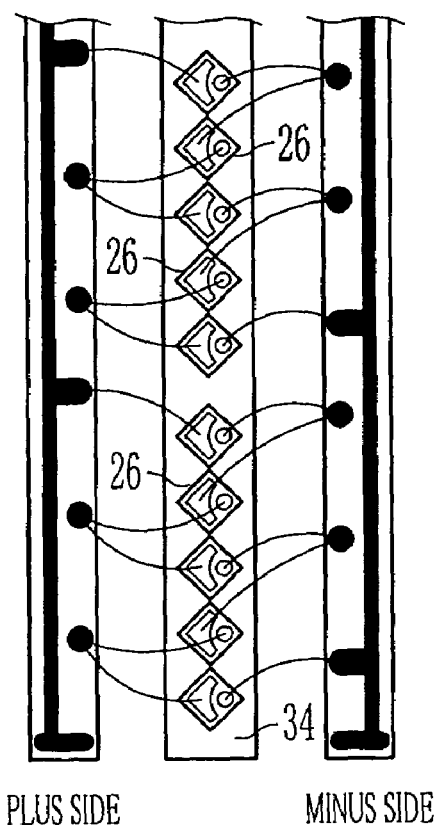
FIG. 6 is an explanatory illustration showing the LED whose arrangement angle is inclined.

The above embodiment is one example and may be variously modified. In the above embodiment, the adjacent LEDs are disposed such that the lateral surfaces thereof are parallel with each other. However, such as shown in FIG. 6, an arrangement angle of the LEDs may be inclined. If the lateral surfaces of the LEDs confront each other, irradiation efficiency is likely to be lowered, since the lateral surface of the LED is the light-emitting surface. The lateral surfaces are prevented from confronting each other by inclining the arrangement angle. Thus, it is possible to prevent the irradiation efficiency from lowering. Incidentally, it is preferable that four lateral surfaces of the LED 26 equally confront the reflection planes (side walls of the groove). In other words, the arrangement angle of inclination is preferable to be 45 degrees.

Figure 7:
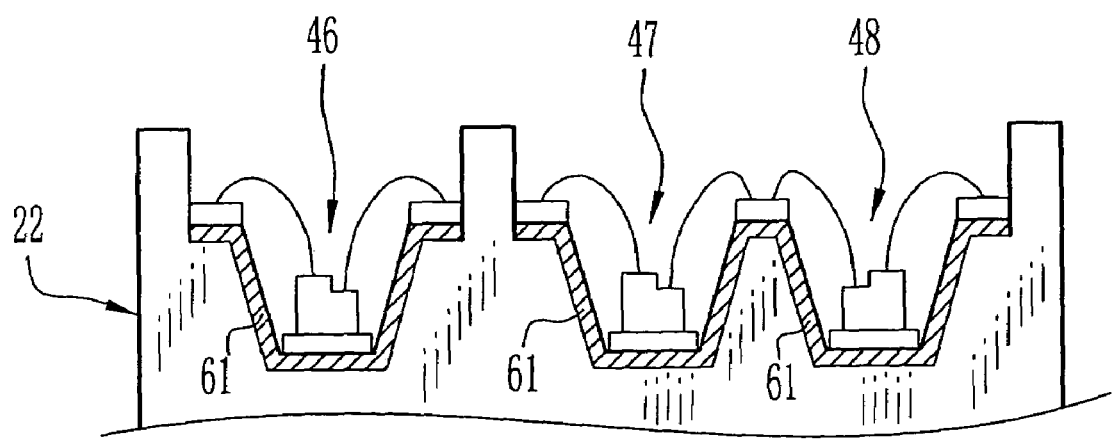
FIG. 7 is an explanatory illustration showing a coating formed on a groove and having high heat conductance.
Figure 8:
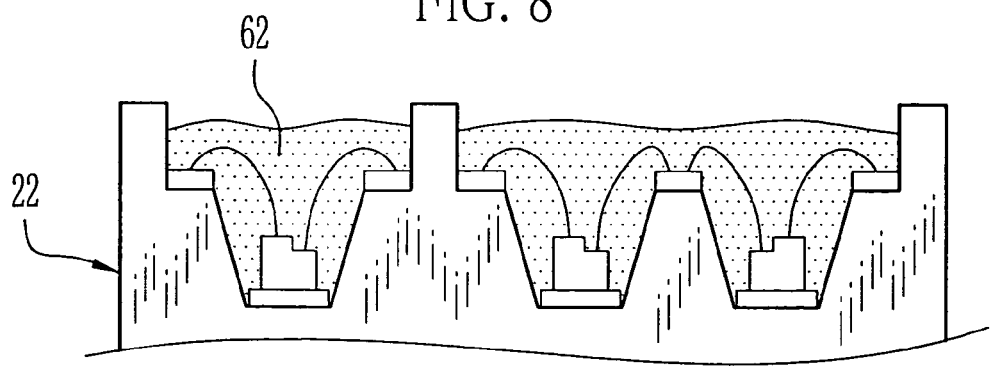
FIG. 8 is an explanatory illustration showing a transparent resin infused into the groove.

As shown in FIG. 7, coatings 61 may be formed on the side walls of the grooves 46 to 48. The coating is made of a material having better heat conductance rather than the attachment stand 22. Thereupon, heat is efficiently radiated. Moreover, such as shown in FIG. 8, a transparent resin 62 of silicone and epoxy may be infused into the grooves to seal the respective arrays 18 and 19. In this case, the respective arrays and the printed-circuit boards are surely fixed.

Figure 9:
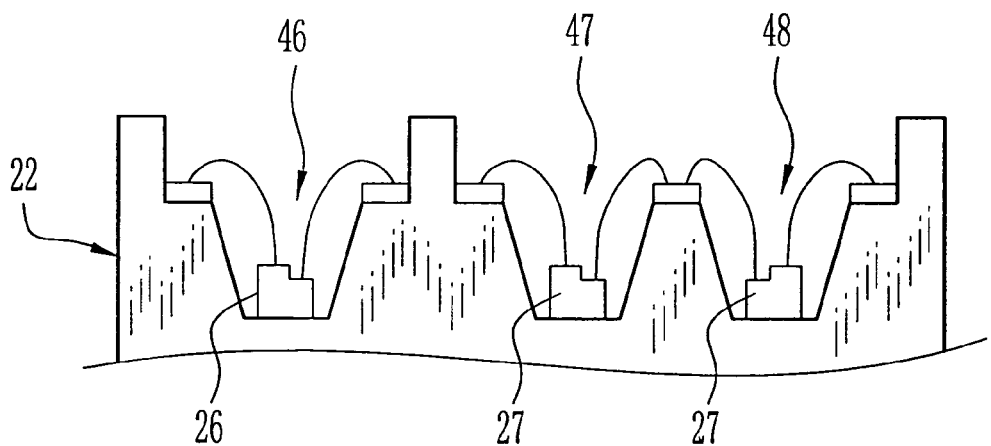
FIG. 9 is an explanatory illustration showing the LDE directly mounted on the attachment stand.

As shown in FIG. 9, the LEDs 26 and 27 may be directly mounted on the bottom surfaces of the grooves 46 to 48 without using the plate. In this case, it is preferable for bonding the LEDs 26 and 27 to use an adhesive having good heat conductance. When the LEDs 26 and 27 are mounted without using the plate, there are disadvantages in that it takes time for assembly and the cost is likely to increase, in comparison with the case in that the plate is used. However, there is an advantage in that a high heat-radiating property is obtained.

Figure 10:
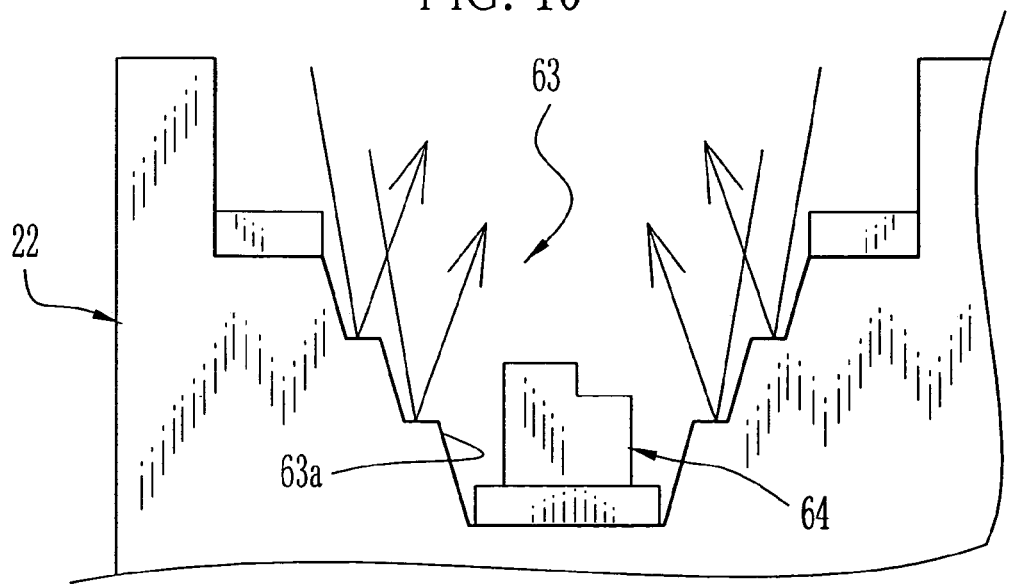
FIG. 10 is an explanatory illustration showing a groove wall formed in a stepwise state.

As shown in FIG. 10, a side wall 63a of a groove 63 may have a lower portion, which is near to a light-emitting element array 64 and is formed in a stepwise state. The light, which is emitted from the array 64 toward the recording paper and is reflected by a surface of the recording paper, is reflected again by the lower portion of the side wall 63a toward the recording paper.

Figure 11A:
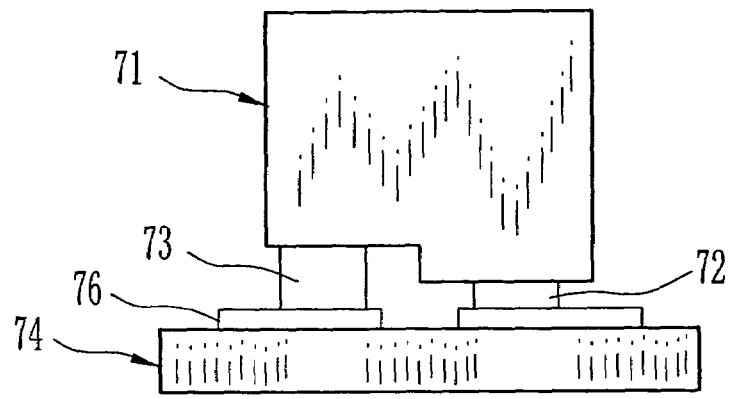
FIGS. 11A and 11B are explanatory illustrations showing an LED of a flip-chip type.
Figure 11B:
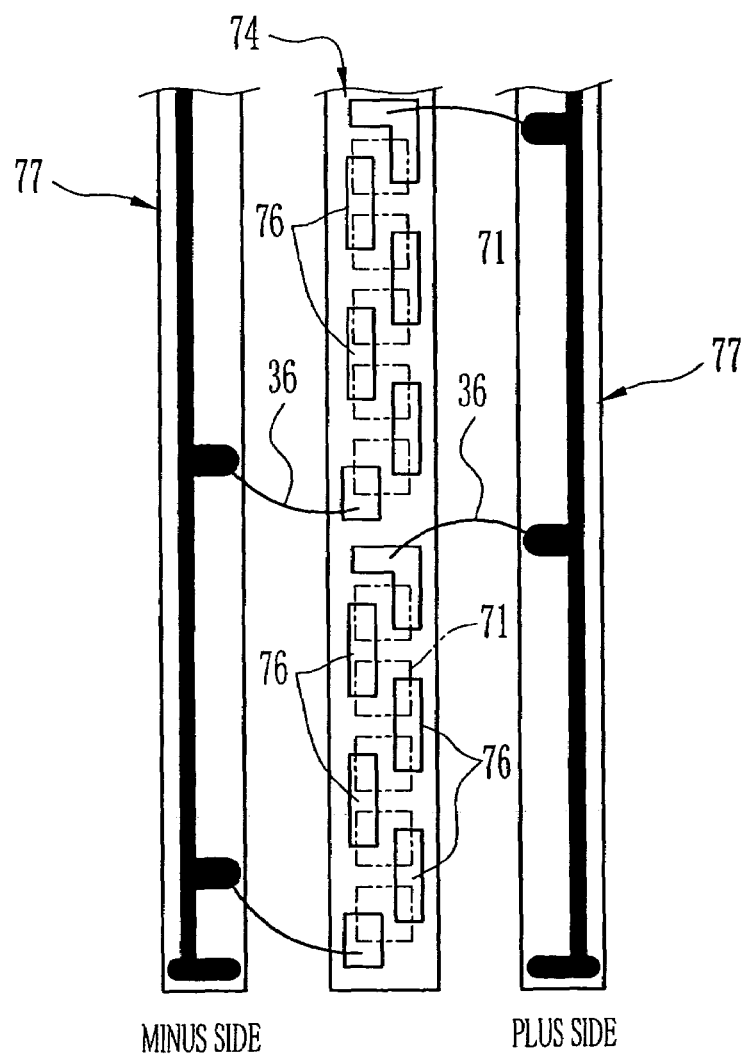

As shown in FIG. 11, an LED 71 of a flip-chip type may be used to directly mount p and n electrodes 72 and 73 of the LED 71 on a plate 74. In this case, it is necessary to provide a conductive portion 76 for electrically connecting the respective electrodes 72 and 73 with a printed-circuit board 77. By using the LED 71 of the flip-chip type, it is possible to prevent a trouble in that wires are short-circuited, for example. This is because the wires 36 for bonding the light-emitting element array to the printed-circuit board 77 may be reduced.

Figure 12A:
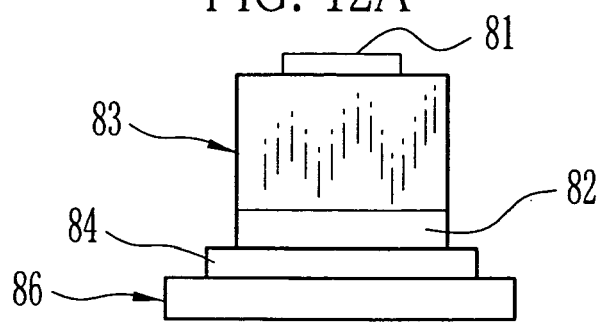
FIGS. 12A, 12B and 12C are explanatory illustrations showing an LED having electrodes provided on upper and lower surfaces.
Figure 12B:
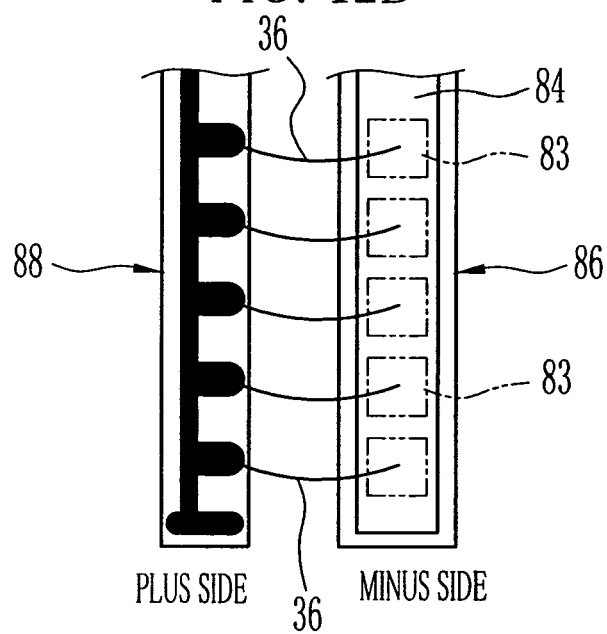
Figure 12C:
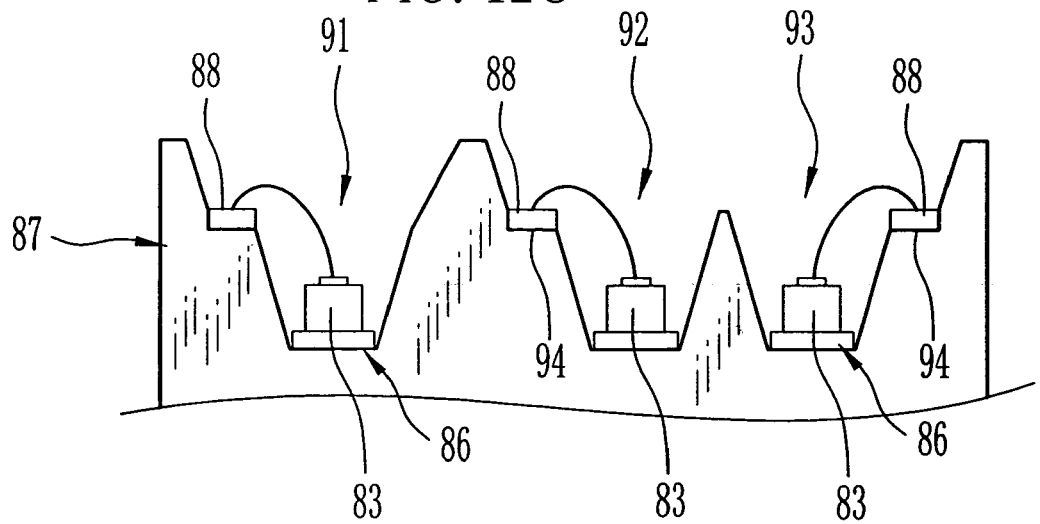

An LED 83 shown in FIG. 12 may be used. An upper surface and a lower surface of the LED 83 are provided with p and n electrodes 81 and 82 respectively. In this case, a printed-circuit board 86 of a minus side has a conductive portion 84 to be connected to the n electrode 82. The circuit board 86 is also used as a plate for mounting the LED 83. Thus, a step 94 on which a printed-circuit board 88 of a plus side is placed is merely formed in each of grooves 91 to 93 of an attachment stand 87. In this embodiment, since the conductive portion 84 is used as a common electrode of the minus side, the respective LEDs are connected in parallel.

Figure 13:
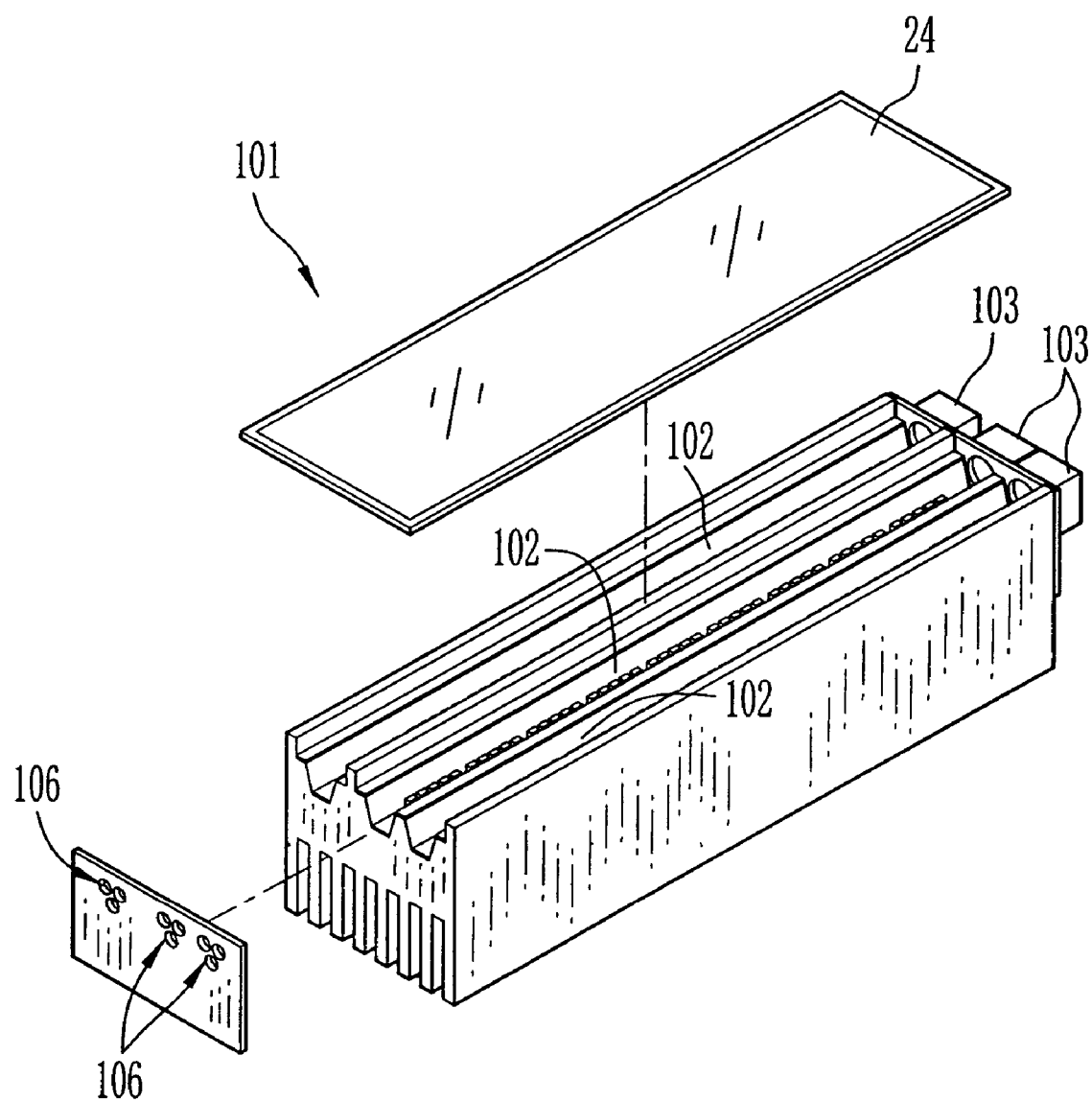
FIG. 13 is an explanatory illustration showing an air intake fan provided on a side surface.

Such as shown in FIG. 13, an optical fixing unit 101 may be provided with air intake fans 103 for sending the air to each groove 102. The fans 103 are provided in accordance with a number of the grooves 102. Exhaust ports 106 are formed in one side plate, which is opposite to the other side plate provided with the air intake fan 103. Of course, exhaust fans may be provided instead of the air intake funs. In this case, the exhaust port works as an air intake port.

In the about embodiments, the light-source unit of the present invention is used as the light source for optical fixation, but may be used as another light source for reading an original. In this case, a luminescence wavelength is properly selected in accordance with intended use. Further, in the above embodiments, the LED is used as the light-emitting element. The LED, however, is not exclusive. It is possible to use various light-emitting elements of semiconductor laser device, which emits the light from its surface, and so forth.

Although the present invention has been fully described by way of the preferred embodiments thereof with reference to the accompanying drawings, various changes and modifications will be apparent to those having skill in this field. Therefore, unless otherwise these changes and modifications depart from the scope of the present invention, they should be construed as included therein.

What is claimed is:

1. A light source unit comprising:
   at least one light-emitting element array having a plurality of light-emitting elements arranged in line;
   a printed-circuit board provided separately from said light-emitting element array, and having a printed circuit pattern to be bonded with said light-emitting element array by wires; and
   an attachment stand to which said light-emitting element array and said printed-circuit board are fixed, said attachment stand being formed with a substantially V-shaped groove for placing said light-emitting element array, and a side wall of said groove being disposed as a reflection plane in a longitudinal direction of said light-emitting element array,
   wherein said light-emitting element array is placed on a bottom surface of said groove, and said printed-circuit board is placed on a step formed at a part of said side wall of said groove.

2. A light source unit according to claim 1, wherein said light-emitting element array has one of a plate and a sheet for fixing said light-emitting elements, and said light-emitting element array is fixed to said attachment stand via one of said plate and said sheet.

3. A light source unit according to claim 1, wherein said light-emitting element is directly attached to said bottom surface of said groove.

4. A light source unit according to claim 1, wherein said groove is covered with a reflection coating formed from a metal and a dielectric.

5. A light source unit according to claim 1, wherein said light-emitting element is a chip-type element substantially having a parallelepiped shape, and the respective light-emitting elements are disposed so as to prevent lateral surfaces of the adjacent light-emitting elements from confronting each other.

6. A light source unit according to claim 1, wherein said attachment stand is integrally formed with a heat sink.

7. A light-source unit according to claim 6, wherein a fan is fixed to said heat sink.

8. A light source unit according to claim 1, wherein at least two kinds of said light-emitting element arrays are provided to radiate rays having different wavelengths.

9. A light source unit according to claim 1, wherein said light-emitting element array is sealed with a transparent resin infused into said groove.

10. A light source unit according to claim 1, wherein said light-emitting element is a light-emitting diode.

11. A light source unit according to claim 1, further comprising:
    an air intake fan for sending air to said groove, said air intake fan being fixed to one side plate of said attachment stand in said longitudinal direction; and
    an exhaust port formed in the other side plate of said attachment stand in said longitudinal direction.

* * * * *